United States Patent
Newman et al.

(10) Patent No.: US 7,605,718 B2
(45) Date of Patent: Oct. 20, 2009

(54) MONITORING DEVICE FOR TRANSPORT PODS

(75) Inventors: Paul Newman, Milpitas, CA (US); Rocco D. Pochy, Milpitas, CA (US); Morgan Polen, Milpitas, CA (US); Scott H. Salton, Fremont, CA (US); Thomas C. Saunders, Milpitas, CA (US)

(73) Assignee: Lighthouse Worldwide Solutions, Inc., San Jose, CA (US)

( * ) Notice: Subject to any disclaimer, the term of this patent is extended or adjusted under 35 U.S.C. 154(b) by 225 days.

(21) Appl. No.: 10/561,100

(22) PCT Filed: Jul. 11, 2005

(86) PCT No.: PCT/US2005/024176

§ 371 (c)(1),
(2), (4) Date: Dec. 17, 2005

(87) PCT Pub. No.: WO2006/017142

PCT Pub. Date: Feb. 16, 2006

(65) Prior Publication Data

US 2007/0139854 A1    Jun. 21, 2007

(51) Int. Cl.
*G08B 21/00* (2006.01)
(52) U.S. Cl. .................. 340/870.16; 414/217; 257/414; 73/865.9

(58) Field of Classification Search ............ 340/539.26, 340/540, 601, 602, 603, 627, 632, 673, 693.5, 340/693.12, 870.16; 414/217; 73/865.9
See application file for complete search history.

(56) References Cited

U.S. PATENT DOCUMENTS

| 6,884,639 B2 * | 4/2005 | Dougan et al. ................. 438/14 |
| 2002/0124906 A1 * | 9/2002 | Suzuki et al. ................. 141/98 |
| 2004/0267501 A1 * | 12/2004 | Freed et al. ................. 702/184 |

FOREIGN PATENT DOCUMENTS

WO    WO 98/59229    * 12/1998

* cited by examiner

*Primary Examiner*—Toan N Pham
*Assistant Examiner*—Travis R Hunnings
(74) *Attorney, Agent, or Firm*—Michael L. Greenberg, Esq.; Greenberg & Lieberman, LLC

(57) ABSTRACT

A device that fits inside a transport pod communicating with the slots of the transport pod so that the device can be inserted and removed from the transport pod. The transport pods are for silicon wafers. The device has sensors that monitor the environment within the transport pod. Depending on the device's size, silicon wafers may be able to accompany the device so that the device can monitor the precise environment the silicon wafers are exposed to while inside the transport pod. The device may also be placed in a transport pod and run through the manufacturing process as one transport pod in a series. The results on the environmental monitoring can be used for alarms and monitoring or data logging to improve the yield of the silicon wafers.

2 Claims, 1 Drawing Sheet

MONITORING DEVICE FOR TRANSPORT PODS

FIELD OF THE INVENTION

The field of the invention relates to devices and methods for monitoring the environments products are exposed to during the manufacturing processes and specifically the environment a silicon wafer is exposed to in a transport pod.

BACKGROUND OF THE INVENTION

Because of the small size of semiconductors in the manufacturing of semiconductors it is critical that particles and other contaminates not be permitted to contaminate the process. Particles as small as 0.1 μm can contaminate the process and cause defects on the silicon wafers. The first generation of semiconductor manufacturing facilities were built with the so-called open ballroom concept. Here an attempt to keep the entire facility free of particles and other contaminates was made. Each successive generation of manufacturing facility design has made the clean space where particles and other contaminates are eliminated smaller and smaller. The latest design of manufacturing facility has what are called minienvironments. These environments are just big enough to contain the tools that work on the silicon wafers. Silicon wafers are transported from tool to tool in transport pods that attach to the tools in a process that is analogous to two space ships docking. The transport pods are meant to provide the silicon wafers with a protective environment. The silicon wafers are either being processed by a tool, being loaded into or out of a tool, being transported, or being stored. The transport pods are sealed; however, such things as temperature and electromagnetic flux as well as particles can cause defects on the silicon wafers.

Two different types of transport pods are used. The first type is referred to as a SMIF (Standard Machine Interface Pod). These transport pods are designed for use on silicon wafers with diameters of 200 mm and less. The second type of pod is referred to as FOUP (Front Opening Unified Pod). FOUP's are for wafers of 300 mm only.

There are multiple reasons why a silicon wafer may fail to be manufactured properly. Among the reasons are contaminates and poorly calibrated tools. Knowing the environment that a silicon wafer was exposed to during the manufacturing process provides information that can lead to greater yields by narrowing the possible reasons for failures or successes. Further, by monitoring the environment a silicon wafer is exposed to during the manufacturing process, contaminates that may be harming the process can be identified before more wafers are contaminated.

There are methods for sampling the transport pods and the minienvironments; however, these are invasive procedures that require the pods' seal to be opened or the minienvironment to be compromised to allow access to the sampling system.

Thus a need has been established for a device that can monitor the environment that wafers are exposed to throughout the manufacturing process without the need to penetrate the protective environment of the transport pod or the minienvironment.

SUMMARY OF THE INVENTION

The present invention is a device shaped like two silicon wafers joined with a cylinder. The present invention fits into a silicon wafer transport pod and thus replaces some of the positions for silicon wafers. The purpose of the device is to monitor the environment that the silicon wafers are exposed to during the manufacturing process and to perform various functions. The device maintains a log of all the data from its sensors. The device has a number of non-contact means for communicating and controlling it. The location of the device can be communicated to it by an external means such as IR signals and this information included in the data log.

The present invention includes lights that can communicate information, as transport pods are typically transparent. If desired, the device can send an alarm warning of harmful contaminates. The device has its own power source, as there is not power available inside a transport pod.

BRIEF DESCRIPTION OF THE DRAWING(S)

DETAILED DESCRIPTION OF THE PREFERRED EMBODIMENT(S)

Figure 1:
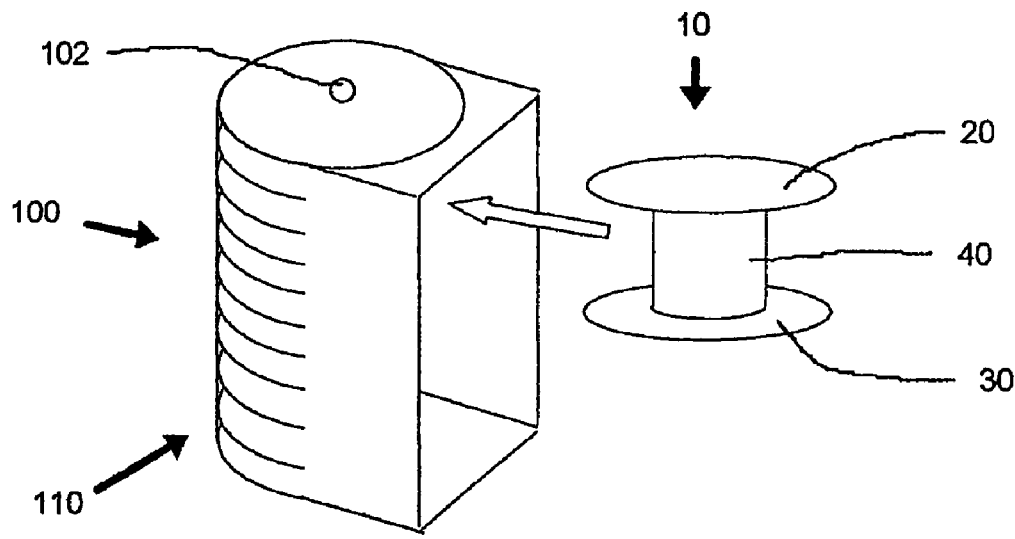
FIG. 1 shows a wafer transport pod and the monitoring device.

FIG. 1 shows a silicon wafer transfer pod (100) and the preferred embodiment for the monitoring device (10). The present invention is designed for monitoring the environment inside the silicon wafer transfer pod (100). The silicon wafer transport pod (100) is well known in the semiconductor manufacturing industry and has two widely used forms called Front Opening Unified Pod (FOUP) and Standard Mechanical Interface Pod (SMIF).

The transport pod (100) is designed to be sealed to prevent contamination to the wafers (not shown). The transport pod (100) is used to move the silicon wafers from tool (or processing station) to tool or for storing the wafers (not shown). The main design goal of the transport pod (100) is to prevent the wafers (not shown) from experiencing exposure to contamination. The transport pod (100) provides mainly protection from exposure to light and air for the silicon wafers. Other environmental factors can spoil silicon wafer manufacturing. These factors include airflow, particles, temperature, relative humidity, airborne molecular contamination, and electromagnetic fields. Some of these factors such as the electromagnetic fields can penetrate the walls of the transport pod (100) and can be generated by what may appear to be harmless equipment.

The present invention provides the user the ability to monitor the exact environment that a silicon wafer has been exposed to during the manufacturing process, while the silicon wafer is in the transport pod (100) or mini-environment. There are a variety of mini sensors that are in the field, but they are more expensive then conventional sensor systems. So the problem is how to get the conventional sensors inside a transport pod (100) without contaminating the transport pod (100) and with the ability to communicate with external data logging and processing equipment.

The monitoring device (10) is designed to have a shape that will fit inside the transport pod (100) designed for silicon wafers. The monitoring device (10) has a top part (20) and a bottom part (30) of the same circular shape as a silicon wafer. Silicon wafers have two common sizes of 8 and 12 inches. The top part (10) and the bottom part (30) are designed to fit within the transport pod's slots (110) and provide support for the monitoring device (10).

Between the top part (20) and the bottom part (30) there is cylinder (40) that holds the top part (20) and the bottom part (30) together and provides space for the equipment necessary for the monitoring device. In the preferred embodiment the structure that holds the top and bottom together is a cylinder (40); however, many different forms could be used, including just conventional rods of a conventional material. In the preferred embodiment, the monitoring device (10) fits inside the transport pod (100) taking only some of the places for the wafers (not shown). For example, if there were room for 25 wafers in a the transport pod (100), then the monitoring device (10) may only take 15 of the wafers' places. By only taking some of the places of the silicon wafers, the monitoring device (10) can then accompany silicon wafers throughout the manufacturing processes.

Alternatively, the transport pod (100) can be run through the manufacturing process without silicon wafers and provide information about the environment that the series of transport pods (100) are exposed to during the manufacturing process. This could provide both important information and could be used as an alarm means so that following transport pods (100) are not exposed to a harmful environmental factor.

Figure 2:
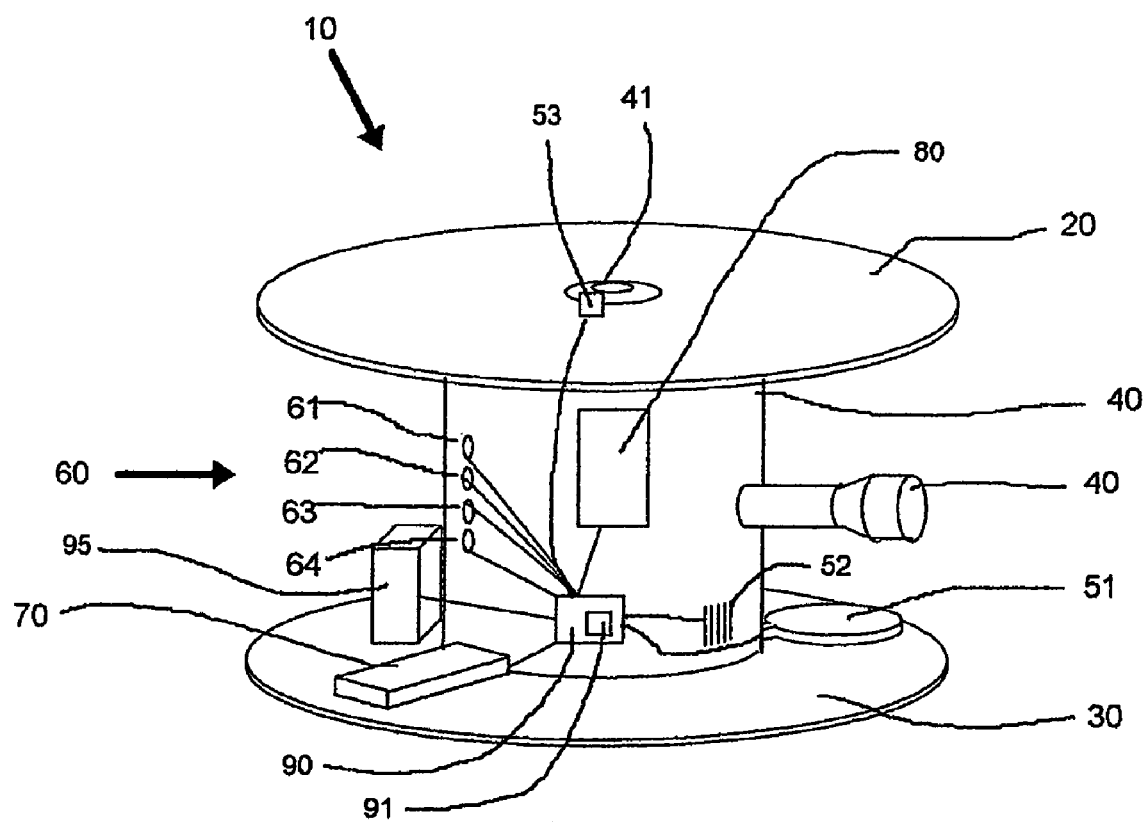
FIG. 2 shows the monitoring device.

FIG. 2 shows greater detail of the preferred embodiment of the present invention. The sample tube (40) draws in air to a conventional particle detector (80), where the air is sampled for particles and then sent out the air exhaust port (41). The air is put out near the transport pod exhaust port (102). The air is filtered by the particle detector in a conventional means to insure the sensor does not introduce any particles in the transport pod's (100) environment. The particle detector (80) is connected to a control unit (90) by conventional means. In other embodiments the particle detector (80) could be another type of sensor or could be connected with conventional means in series with another type of sensor.

The control unit (90) contains within it a local buffer (91) using conventional means such as semiconductor memory. The local buffer (91) allows the monitoring device (10) to record environmental conditions over a period of time and to maintain any further information provided to the monitoring device (10) such as the location of the transport pod (100).

There are conventional sensors (51, 52), which record such things as relative humidity, temperature, airflow, and electromagnetic fields. These conventional sensors (51, 52) are connected to the control unit (90) by conventional means and report their reading to the control unit (90).

There is a wireless link (70) for communication. The wireless link (70) is connected to the control unit (90) by conventional means. The wireless link (70) allows the control unit (90) to communicate to the facility operators and equipment and allows facility operators and equipment to communicate to the control unit (90). Such things as alarms signals generated by the control unit (90) monitoring the results of a data reading from one of the conventional sensors (51, 52) or the particle detector (80) would be examples of the types of communication that occur. The facility equipment may communicate to the monitoring device (10) its current location within in the facility so that the monitoring device (10) can keep a data log of all the data reading along with the monitoring device's (10) location.

There are status lights (60), which can display the status of the monitoring device (10). Transport pods (100) are conventionally transparent so these lights would be visible from outside the transport pod (100). A warning light (60) can signal a warning if the wafers have been exposed to contaminants. The warning light (60) is connected to the control unit (90) by conventional electric means. The warning light (60) would get a signal to light up when the control unit (90) received a data reading from one of the sensors (51, 52, 80) and the data reading had been preprogrammed to be within a range that should cause a warning signal. All of this can be done with conventional means with the use of electronics in the control unit (90).

A conventional battery (95) must be provided as the transport pod (100) provides no power. The power light (61) is a power indicator. The power light (61) is connected to the control unit (90) and the control unit (90) is connected to the battery (95). The logic to provide the following functions for the power light (61) is conventionally implemented in the control unit (95). A steady power light (61) indicates nominal power, while a flashing power light (61) indicates the battery (95) is low. Flow light (62) indicates whether there is nominal flow through the exhaust port (41). The flow light (62) is connected to the control unit (90) and a conventional flow sensor (53) is connected to the control unit. The control unit (90) then by conventional means controls the flow light (62).

Failure light (63) is connected to the control unit (90) by conventional means and the control unit (90) turns the failure light (63) on when there is a hardware problem that prevents the device from recording the environmental data. Recording light (64) is connected to the control unit (90) by conventional means and indicates that the device is monitoring and recording the environmental data.

The monitoring device (10) contains non-contact means of communicating with and controlling the monitoring device (10). The monitoring device (10) also may contain magnetic switches so that someone could communicate with the monitoring device (10) without opening the transport pod (100). The monitoring device (10) may also contain a IR system for high bandwidth down load of the data. The non-contact communication with the monitoring device (10) may provide a means of communicating to the monitoring device (10) its current location within the manufacturing process. This data could be critical in eliminating the contaminates from within the facility.

The monitoring device (10) may also act as an alarm so that immediate action can be taken before millions of dollars worth of silicon wafers are destroyed. For example conventional sensor (51) could be a relative humidity sensor and send a data reading to the control unit (90) that the control unit (90) interprets as critically high. The control unit could then send a signal using the wireless communicator (70). The facility equipment would then receive this signal and use it to notify facility personnel or to automatically stop the equipment.

Having illustrated the present invention, it should be understood that various adjustments and versions might be implemented without venturing away from the essence of the present invention. The present invention is not limited to the embodiments described above, and should be interpreted as any and all embodiments within the scope of the following claims.

We claim:

1. A monitoring device for silicon wafer transfer pods, comprising:

a top part;

a cylinder in communication with said top part;

a bottom part in communication with said cylinder;

a control unit in communication with said cylinder;

a particle detector in communication with said control unit, said particle detector facilitating the monitoring;

a wireless link in communication with said control unit; and wherein said top part and said bottom part are configured to fit inside the silicon wafer transfer pods.

2. A monitoring device for silicon wafer transfer pods, comprising:

a top part;

a cylinder in communication with said top part;

a bottom part in communication with said cylinder;

a control unit in communication with said cylinder;

a particle detector in communication with said control unit, said particle detector facilitating the monitoring;

a sample tube configured to draw air into said particle detector;

an exhaust port configured to exhaust the air from said particle detector;

a wireless link in communication with said control unit; and wherein said top part and said bottom part are configured to fit inside the silicon wafer transfer pods.

* * * * *